United States Patent
Asaka et al.

(10) Patent No.: US 8,004,146 B2
(45) Date of Patent: Aug. 23, 2011

(54) ELECTRICALLY CONDUCTIVE THIN FILM FORMED FROM AN IONIC LIQUID AND CARBON NANOTUBES HAVING A HIGH ASPECT RATIO, AND ACTUATOR ELEMENT COMPRISING THE THIN FILM

(75) Inventors: Kinji Asaka, Ikeda (JP); Ken Mukai, Ikeda (JP); Kenji Hata, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 206 days.

(21) Appl. No.: 12/213,068

(22) Filed: Jun. 13, 2008

(65) Prior Publication Data

US 2009/0115286 A1  May 7, 2009

(30) Foreign Application Priority Data

Jun. 25, 2007 (JP) ................. 2007-165778
Aug. 24, 2007 (JP) ................. 2007-217861

(51) Int. Cl.
*H01L 41/08* (2006.01)

(52) U.S. Cl. ......... 310/300; 310/363; 310/311; 310/328

(58) Field of Classification Search ............... 310/363, 310/300, 328; 252/500, 502; 423/447.3, 423/447.1; 427/180; 977/742, 750; *H01L 41/08, H01L 41/00*
See application file for complete search history.

(56) References Cited

U.S. PATENT DOCUMENTS

| | | | | |
|---|---|---|---|---|
| 6,333,016 B1 * | 12/2001 | Resasco et al. | ............ | 423/447.3 |
| 7,531,114 B2 * | 5/2009 | Fukushima et al. | ....... | 423/447.3 |
| 7,863,798 B2 * | 1/2011 | Regan et al. | ................. | 310/300 |
| 2003/0077515 A1 * | 4/2003 | Chen et al. | ................. | 429/231.8 |
| 2006/0257645 A1 | 11/2006 | Asaka et al. | ................. | 428/323 |
| 2006/0266981 A1 | 11/2006 | Asaka et al. | ................. | 252/500 |

FOREIGN PATENT DOCUMENTS

| | | |
|---|---|---|
| JP | 2005-176428 | 6/2005 |
| JP | 2007-126624 | 5/2007 |
| WO | WO 02/063073 | * 8/2002 |

OTHER PUBLICATIONS

Fully Plastic Actutor Through Layer-by-Layer Casting with Inoic-Liquid-Based Bucky Gel( Angew. Chem.Int ED 2005, vol. 44,p. 2410-2413).*
Solid state Actuator Based on PolyPyrrole and Polymer-in-ionic liquid Eletrolytes Electrochimica Acta(2003) vol. 48 p. 2355-2359.*
Takanori Fukushima, et al.: Fully Plastic Actuator through Layer-by-Layer Casting with Ionic-Liquid-Based Bucky Gel, Angew. Chem. Int. Ed. 2005, 44, 2-4.
Ken Mukai, et al.: High performance fully plastic actuator based on ionic-liquid-based bucky gel, Electrochem, Acta, 53 (2008) 5555-5562.

* cited by examiner

*Primary Examiner* — Thomas M Dougherty
*Assistant Examiner* — Karen Addison
(74) *Attorney, Agent, or Firm* — Kratz, Quintos & Hanson, LLP

(57) ABSTRACT

The present invention provides an actuator exhibiting improved performance. The actuator is formed of an electrically conductive thin film formed from an ionic liquid and carbon nanotubes having an aspect ratio of not less than $10^4$; or an electrically conductive thin film formed from an ionic liquid and carbon nanotubes having a length of not less than 50 µm.

8 Claims, 3 Drawing Sheets

Explanatory view of method for measuring displacement

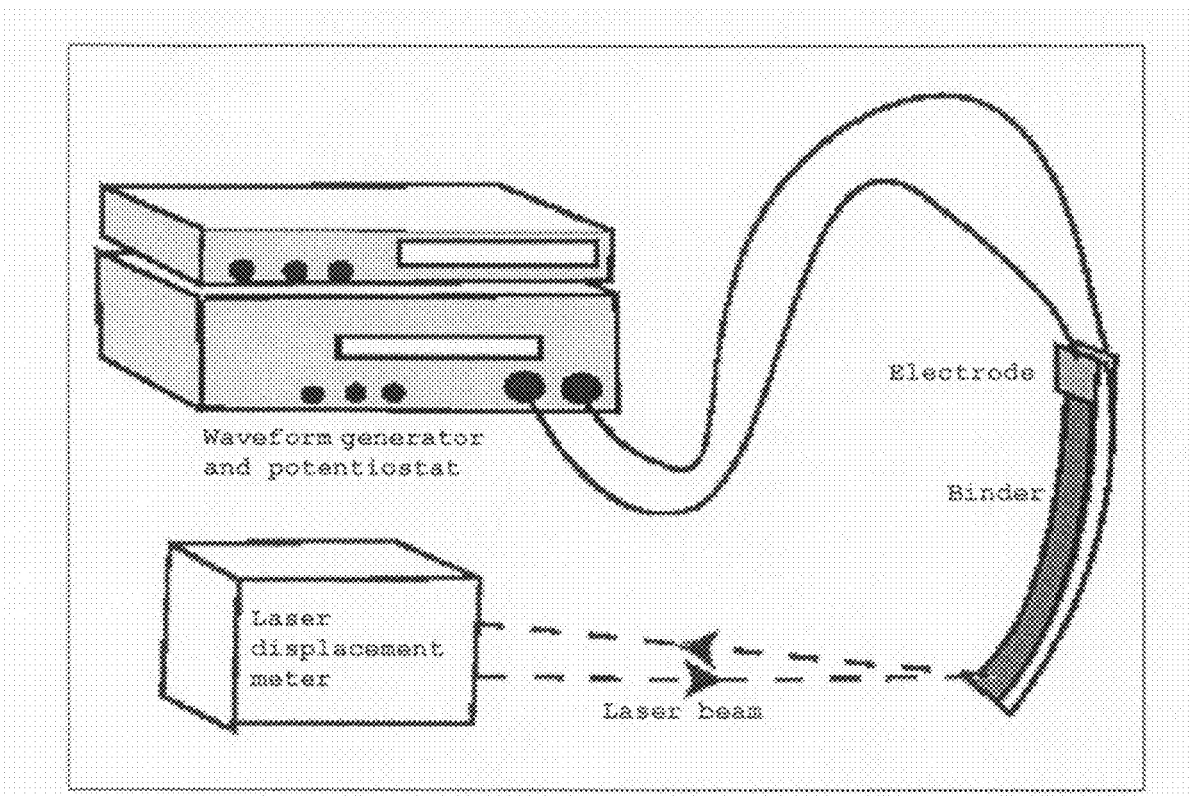
FIG. 1
Explanatory view of method for measuring displacement
FIG. 2
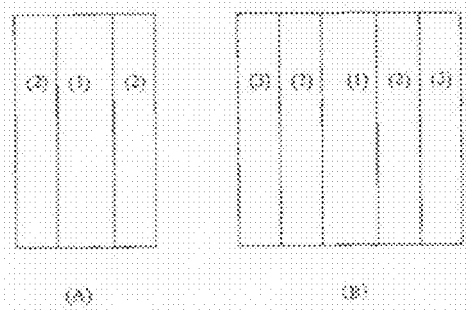
(A)　　　(B)

Photographs of the appearance of an electrode film
The right- and left-side pictures show the front and rear sides of the film.

ELECTRICALLY CONDUCTIVE THIN FILM FORMED FROM AN IONIC LIQUID AND CARBON NANOTUBES HAVING A HIGH ASPECT RATIO, AND ACTUATOR ELEMENT COMPRISING THE THIN FILM

BACKGROUND OF THE INVENTION (1) Field of the Invention

The present invention relates to an electric conductor having an electrically conductive thin film, an actuator element using the electric conductor, and a method for producing the actuator. The actuator element of the invention is driven by an electrochemical process such as an electrochemical reaction, the charging and discharging of an electric double layer.

(2) Description of the Related Art

Patent Document 1 discloses an actuator element; the actuator comprises, as an active layer exhibiting conductivity and flexibility, a gel containing carbon nanotubes and an ionic liquid, and is capable of operating in air or in a vacuum.

Carbon nanotubes used as electric conductors are required to have excellent properties, such as high purity, high aspect ratio, high electric conductivity, and high specific surface area.

According to the known processes for producing actuator elements, it is difficult to uniformly mix polymer, ionic liquid, and carbon nanotube having the above excellent properties. As a result, the actuator obtained cannot exhibit desired high performance.

Known carbon nanotube have a length of about a few μm, making it difficult to form, using such type of carbon nanotube alone, a uniform electrode film that exhibits high electric conductivity. To alleviate the difficulty, a simple method of casting a mixture of carbon nanotube and a polymer binder makes it possible to easily obtain an electrically conductive thin film. The addition of a polymer, however, prevents uniform distribution of the carbon nanotubes in the film, and leads to lowered electronic and ionic conductions.

Patent Document 1: Japanese Unexamined Patent Application Publication No. 2005-176428

BRIEF SUMMARY OF THE INVENTION

Problem to be Solved by the Invention

An object of the present invention is to provide an actuator exhibiting improved performance over known actuators.

Means for Solving the Problem

The present invention aims to solve the problems described above. The present inventors found that an electrically conductive film comprising carbon nanotubes and an ionic liquid can be obtained by a simple method, i.e., casting, without adding a polymer, by using extremely long carbon nanotubes having a very large aspect ratio. The present inventors also found the characteristics of the thus-obtained actuator.

The present invention provides the electrically conductive thin films, laminates, actuator elements and the method for producing the same as below.

Item 1. An electrically conductive thin film formed from an ionic liquid and carbon nanotubes having an aspect ratio of not less than $10^4$.

Item 2. An electrically conductive thin film formed from an ionic liquid and carbon nanotubes having a length of not less than 50 μm.

Item 3. A laminate comprising the electrically conductive thin film layer of Item 1 or 2 and an ion conductive layer.

Item 4. An actuator element comprising the laminate of Item 3.

Item 5. An actuator element according to Item 4, wherein at least two electrically conductive thin film layers having the electrically conductive thin film of Item 1 or 2 as the electrode are formed on the surface of the ion conductive layer in such a manner that the two layers are insulated to each other, and the actuator element is deformable by applying potential difference to the electrically conductive thin film layers.

Item 6. A method for producing an actuator element comprising the steps of:

Step 1: preparing a dispersion containing carbon nanotubes having an aspect ratio of not less than $10^4$ or a length of not less than 50 μm, an ionic liquid, and a solvent;

Step 2: preparing a solution containing a polymer, a solvent, and, if necessary, an ionic liquid;

Step 3: forming a laminate of an electrically conductive thin film layer and an ion conductive layer by simultaneously or subsequently forming an electrically conductive thin film using the dispersion of Step 1 and the ion conductive layer using the solution of Step 2.

Item 7. A method for producing an actuator element comprising the steps of:

Step 1: preparing a dispersion containing carbon nanotubes having an aspect ratio of not less than $10^4$ or length of not less than 50 μm, an ionic liquid, and a solvent;

Step 2: preparing a solution containing a polymer, a solvent, and, if necessary, an ionic liquid;

Step 3: forming an electrically conductive thin film by casting, printing, coating, extrusion or injection using the dispersion prepared in Step 1, and then, if increased density is needed, subjecting the thus-obtained electrically conductive thin film to thermal consolidation or subjecting a plurality of electrically conductive thin films to simultaneous thermopress bonding and thermal consolidation;

Step 4: forming an ion conductive layer by casting, printing, coating, extrusion or injection using the dispersion prepared in Step 2; and Step 5: forming a laminate by stacking the electrically conductive thin film prepared in Step 3 and the ion conductive layer prepared in Step 4.

EFFECTS OF THE INVENTION

The present invention makes it possible to obtain an electrically conductive thin film without adding a polymer. This improves response speed, electronic conductivity and ion conductivity, and lightens the element or eases deformation of the element. Accordingly, the present invention provides an actuator element that is deformable and highly efficient.

BRIEF DESCRIPTION OF SEVERAL VIEWS OF THE DRAWINGS

FIG. 1 shows a laser displacement meter used for evaluation of the displacement of the actuator element in the Examples of the present invention.

FIG. 2 (A) shows a schematic diagram of an example of the actuator element (three-layer structure) of the present invention, and FIG. 2 (B) shows a schematic diagram of an example of the actuator element (five-layer structure) of the present invention.

BEST MODE FOR CARRYING OUT THE INVENTION

Figure 3:
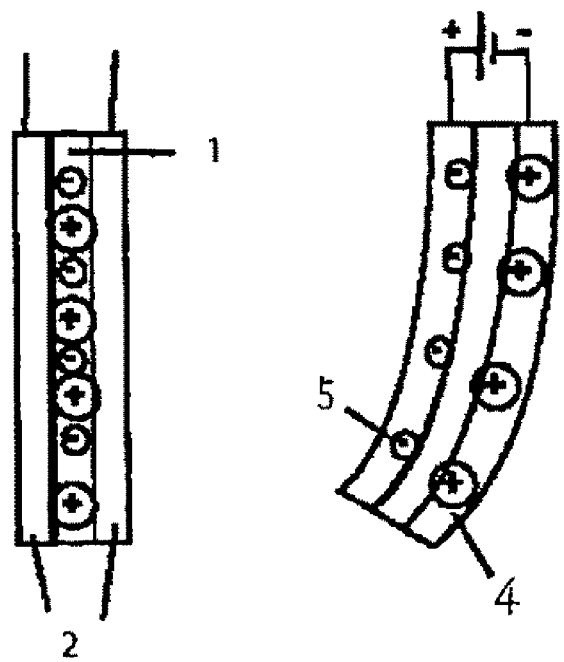
FIG. 3 shows the operation principle of the actuator element of the present invention.

In the present invention, the electrically conductive thin film usable as an electrode layer of an actuator element is formed of carbon nanotubes and an ionic liquid. In other words, the electrically conductive thin film of the present invention is free from polymer.

The ionic liquid used in the present invention may be called room temperature molten salt or simply molten salt. The salt is in a molten condition in a wide range of temperatures including ordinary (room) temperature, and it is molten, for example, at 0° C., preferably −20° C., and more preferably −40° C. The ionic liquid used in the present invention preferably has a high ion conductivity.

In the present invention, various kinds of known ionic liquids can be used, but it is preferable that the ionic liquid be stable and have a liquid form at or near ordinary temperature (room temperature). Examples of the preferable ionic liquids in the present invention include cations (preferably, imidazolium ion, quaternary ammonium ion) represented by General Formulae (I) to (IV) below and anions (X$^-$).

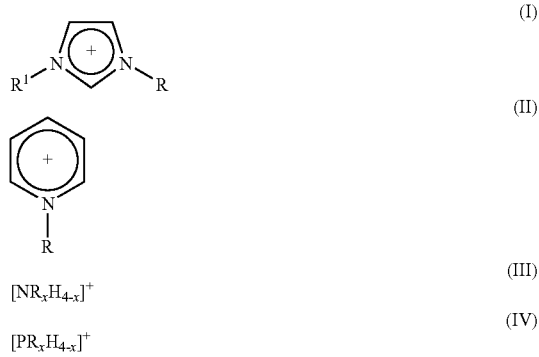

In the General Formulae (I) to (IV), R represents $C_{1-12}$ alkyl group having a straight- or branched-chain, or straight- or branched-chain alkyl group having an ether linkage and the total number of carbon and oxygen of 3 to 12. In General Formula (I), $R^1$ represents $C_{1-4}$ alkyl group having a straight- or branched-chain or a hydrogen atom. In General Formula (I), it is preferable that R and $R^1$ be different. In General Formulae (III) and (IV), each x represents an integer of 1 to 4.

Examples of $C_{1-12}$ straight- or branched-chain alkyl groups include methyl, ethyl, n-propyl, isopropyl, n-butyl, isobutyl, sec-butyl, t-butyl, pentyl, hexyl, heptyl, octyl, nonyl, decyl, undecyl, dodecyl, etc. The number of carbon is preferably 1 to 8, and more preferably 1 to 6. Examples of $C_{1-4}$ alkyl groups having a straight- or branched-chain include methyl, ethyl, n-propyl, isopropyl, n-butyl, isobutyl, sec-butyl, t-butyl, etc.

Examples of alkyl groups having a straight- or branched-chain, an ether linkage, and carbon and oxygen atoms whose total number is 3 to 12 include $CH_2OCH_3$, and $(CH_2)_p(OCH_2CH_2)_qOR^2$ (wherein p is an integer of 1 to 4, q is an integer of 1 to 4, and $R^2$ is $CH_3$ or $C_2H_5$).

Examples of anions (X$^-$) include tetrafluoroboric acid ion ($BF_4^-$), $BF_3CF_3^-$, $BF_3C_2F_5^-$, $BF_3C_3F_7^-$, $BF_3C_4F_9^-$, hexafluorophosphoric acid ion ($PF_6^-$), bis(trifluoromethanesulfonyl)imidic acid ion (($CF_3SO_2)_2N^-$), perchloric acid ion ($ClO_4^-$), tris(trifluoromethanesulfonyl)carbon acid ion (($CF_3SO_2)_3C^-$), trifluoromethanesulfonic acid ion ($CF_3SO_3^-$), dicyanamide ion (($CN)_2N^-$), trifluoroacetic acid ion ($CF_3COO^-$), organic carboxylic acid ion and halogen ion. Specific examples of ionic liquids are those, wherein the cation is 1-ethyl-3-methylimidazolium ion or [N(CH$_3$)(CH$_3$)(C$_2$H$_5$)(C$_2$H$_4$OC$_2$H$_4$OCH$_3$)]$^+$, and the anion is a halogen ion, tetrafluoroboric acid ion, or bis(trifluoromethanesulfonyl)imidic acid ion (($CF_3SO_2)_2N^-$). An ionic liquid comprising 1-ethyl-3-methylimidazolium ion and bis(trifluoromethanesulfonyl)imidic acid ion (($CF_3SO_2)_2N^-$) is particularly preferable. It is also possible to further lower the melting point by using two or more cations and/or anions. There is no limitation to the combination as long as the ionic liquid has an electric conductivity of not less than 0.1 Sm$^{-1}$.

The carbon nanotube usable in the present invention is a carbon-based material having a structure wherein a graphene sheet is wound into a cylindrical shape. Carbon nanotubes are roughly divided into two groups according to the construction of the peripheral wall, i.e., single-wall nanotubes (SWNT) and multi-wall nanotubes (MWNT). There are many types of carbon nanotubes depending on its graphene sheet structure, such as chiral (spiral) types, zigzag types, and armchair types. Any type of carbon nanotube can be used in the present invention, as long as they belong to a so-called carbon nanotube category.

The carbon nanotube used in the present invention has an aspect ratio of not less than 10$^4$. Larger aspect ratios are more preferable; however, the upper limit thereof is, for example, about 10$^6$. The length of carbon nanotube is generally not less than 1 µm, preferably not less than 50 µm, and more preferably not less than 500 µm. There is no particular upper limit to the length of carbon nanotube, but it is generally, for example, about 3 mm.

A preferable example of a practically usable carbon nanotube includes HiPco (product of Nano Technology Inc.), which uses carbon monoxide as a material and can be mass produced. However, useful carbon nanotubes are not limited to this example.

The electrically conductive thin film of the present invention is mainly formed from carbon nanotubes and an ionic liquid, but may further comprise activated carbon fiber, reinforcing materials and the like in such an amount that they do not adversely affect the electrical conductivity and like characteristics of the electrically conductive thin film.

The ion conductive layer of the present invention can be obtained in the following manner. A solution comprising a polymer, a solvent, and, if necessary, an ionic liquid is prepared. The resultant solution is subjected to casting to form a film, and the solvent contained in the film is vaporized so that the film is dried. The ion conductive layer may be formed by coating, printing, extrusion, casting, injection or the like. The solvent may be a mixture of a hydrophilic solvent and a hydrophobic solvent.

Examples of hydrophilic solvents include ethylene carbonate, propylene carbonate, dimethyl carbonate, diethyl carbonate, methyl ethyl carbonate, propylene carbonate, butylene carbonate and like carbonates; tetrahydrofuran and like ethers; acetone, methanol, ethanol and like $C_{1-3}$ lower alcohols; acetonitrile; etc. Examples of usable hydrophobic solvents include 4-methylpentane-2-on and like $C_{5-10}$ ketone group; chloroform, methylene chloride and like halogenated hydrocarbons; toluene, benzene, xylene and like aromatic hydrocarbons; hexane, cyclohexane and like aliphatic or alicyclic hydrocarbons.

Examples of the polymers usable for the ion conductive layer of the present invention include poly(vinylidene fluoride/hexafluoropropylene) copolymer (PVDF(HFP)) and like copolymers of fluorinated olefin and perfluorinated olefin having a hydrogen atom; polyvinylidene fluoride (PVDF) and like homopolymers of fluorinated olefin having a hydrogen atom; perfluorosulfonic acid (Nafion), poly-2-hydroxyethylmethacrylate (poly-HEMA), polymethylmethacrylate (PMMA) and like poly(meth)acrylates; polyethylene oxide (PEO); polyacrylonitrile (PAN); etc.

The electrically conductive thin film layer used for the electrode layer of the actuator element is formed from carbon nanotubes and an ionic liquid. The preferable contents of the components in the electrically conductive thin film layer are as below:

Carbon Nanotubes:
  6 to 90 wt %, preferably 9 to 66 wt %, and more preferably 20 to 50 wt %;
Ionic Liquid:
  10 to 94 wt %, preferably 34 to 91 wt %, and more preferably 50 to 80 wt %.

Preparation of the electrically conductive thin film can be conducted by mixing CNTs and an ionic liquid at an arbitrary ratio. In order to obtain an electrically conductive film of sufficient strength, it is preferable that a certain amount of CNTs be contained.

It is preferable that the CNTs and the ionic liquid be mixed at an arbitrary ratio by stirring, etc., followed by a supersonic treatment. The time for the ultrasonic treatment is preferably about 30 minutes to about 15 hours, and more preferably about 1 hour to about 7 hours.

Formation of the electrically conductive thin film can be conducted by coating, printing, extruding, casting, injecting a mixture of CNTs and an ionic liquid. Among these methods, casting is preferable.

Examples of the actuator element produced by the method of the present invention include a three-layered actuator element as shown in FIG. 2 (A), wherein an ion conductive layer 1 is sandwiched between electrically conductive thin film layers (electrode layers) 2,2, and contains carbon nanotubes, an ionic liquid, and a polymer. The actuator element may be formed as a five-layered structure having conductive layers 3,3 on the outer surfaces of the electrode layers 2,2 to increase the conductivity of the surface of the electrode (FIG. 2(B)).

An actuator element having electrically conductive thin film layers on the surfaces of an ion conductive layer can be obtained by adhering the electrically conductive thin film to the surfaces of the ion conductive layer by thermocompression bonding.

The thickness of the ion conductive layer is preferably 5 μm to 200 μm, and more preferably 10 μm to 100 μm. The thickness of the electrically conductive thin film layer is preferably 10 μm to 500 μm, and more preferably 50 μm to 300 μm. Formation of each film layer may be conducted by spin coating, printing, spraying, etc. It is also possible to employ an extrusion method, injection method or the like.

It is preferable that the thickness of the conductive layer be 10 nm to 50 nm. The electrically conductive thin film may be a single thin film or a lamination obtained by thermocompression bonding a plurality of thin films formed from CNTs and an ionic liquid.

When a direct voltage of 0.5 V to 4 V is applied across the electrodes (the electrodes are connected to the electrically conductive thin film layer) of the thus-obtained actuator element, displacement of about 0.5 to 1 time the length of the element is observed within a few seconds. The actuator element can be flexibly operated in air or in a vacuum.

FIG. 3 shows the operation principle of this actuator element. Specifically, when a potential difference is applied to electrically conductive thin film layers 2,2 formed in an insulated state on the surface of the ion conductive layer 1, an electrical double layer is formed on the interface between the carbon nanotube phase and the ionic liquid phase in the electrically conductive thin film layers 2,2, and the electrically conductive thin film layers 2,2 expand and contract due to the generated interface stress. One assumption as to why the actuator element tends to curve toward the positive electrode as shown in FIG. 3 is that carbon nanotubes expand significantly in the negatively charged side due to the quantum chemical effect. Another assumption follows that in the currently used ionic liquid, cation 4 has a large ion radius, and therefore expands more in the negatively charged side due to the steric effect. In FIG. 3, 4 indicates the cation in the ionic liquid and 5 indicates the anion in the ionic liquid.

In the actuator element obtained by the above-mentioned method, the effective interface area between the carbon nanotube and the ionic liquid in the gel becomes extremely large, and the impedance in the interface electrical double layer becomes small. This contributes to the effective use of the electric elastic effect of the carbon nanotubes. From a mechanical view point, this method increases the adhesion in the connection of the interface, improving the durability of the element. As a result, an element having excellent responsiveness, a large displacement, and sufficient durability either in air or in a vacuum is obtained. Furthermore, the element has a simple structure, and can easily be made smaller and operated even at low electric power.

The actuator element of the present invention operates with excellent durability both in air and in vacuum, and can flexibly operate at a low voltage. Therefore, the actuator element of the present invention is suitably used as an actuator for use in robots that have contact with humans (for example, actuators for use in home robots, pet robots, amusement robots and like personal robots), for which a high degree of safety is required. The actuator element of the present invention is also suitably used as actuators for use in robots that operate under special conditions, such as in space, in vacuum chambers, and during rescues; in surgical devices, muscle suits and like medical devices; in the welfare field; and in micromachines.

There is an increased demand for actuators used to transport specimens or to conduct positioning, in particular, in fields where materials are produced in a vacuum or in extremely clean environments, in order to obtain highly pure products. Accordingly, the actuator element of the present invention, which uses an ionic liquid free from evaporation, can be effectively used, as an actuator free from the risk of contamination, in a process conducted in a vacuum.

Figure 4:
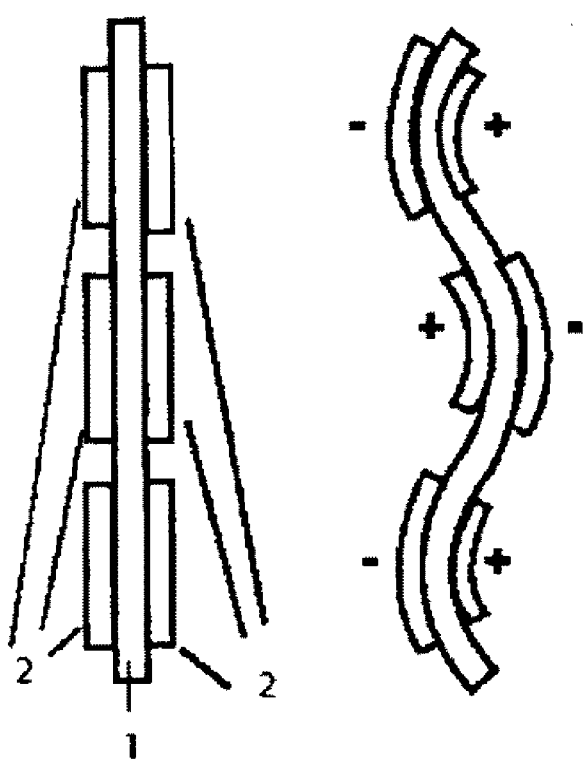
FIG. 4 shows a schematic diagram of another example of the actuator element according to the invention.

At least two electrically conductive thin film layers are formed on the surface of the ion conductive layer; however, as shown in FIG. 4, it is also possible to form a plurality of electrically conductive thin film layers 2 on the surface of a flat ion conductive layer 1 capable of complicated movement.

This element makes it possible to realize transportation through peristaltic movement, micromanipulators, etc. Furthermore, the shape of the actuator element of the present invention is not limited to flat, but can be easily formed into a desirable shape. For example, the element shown in FIG. 4 has a structure wherein four electrically conductive thin film layers 2 are formed around the ion conductive layer 1 rod having a diameter of about 1 mm. By employing this element, an actuator that can be inserted in a canaliculus can be obtained.

EXAMPLES

Hereinafter, the present invention is explained in more detail with reference to Examples. However, the present invention is not limited to these Examples.
Explanations for Common Experimental Procedures:
1. Agents and Materials Used
Ionic Liquids (IL) Used:
Ethyl methylimidazolium tetrafluoroborate (EMIBF$_4$)

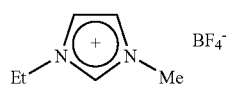

Ethyl methylimidazolium bis(trifluoromethane sulfonyl) imide (EMITFSI)

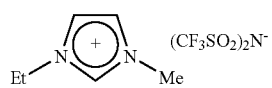

Carbon Nanotube Used:

Carbon nanotube having an aspect ratio of not less than $10^4$ used in the Examples and the Comparative Examples was single-wall carbon nanotube having an average length of about 600 μm (LS-CNT); the carbon nanotube was manufactured by National Institute of Advanced Industrial Science and Technology, Research Center for Advanced Carbon Materials.
Base Polymer Used for Ion Conductor:
Polyvinylidene fluoride-hexafluoropropylene copolymer (PVDF(HFP)) (III)

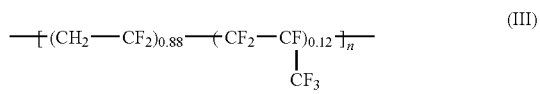

Solvents Used:
N,N'-dimethylacetamide (DMAc)
Propylene carbonate (PC)
Methylpentanone (MP)
2. Method for Manufacturing a Gel Electrolyte Film The temperature of a combined body of 100 mg of IL, 100 mg of PVDF(HFP), 360 mg of PC and 3 ml of MP was raised to 80° C., and the body was agitated for 30 minutes or more. Thereafter, a 0.3 ml quantity of the obtained liquid for casting was poured into a 25 mm×25 mm casting frame, and the solvent was vaporized to obtain a gel electrolyte film. The thickness of the thus-obtained film was about 20 μm.
3. Method for Measuring Displacement of an Actuator Element Comprising Three Layers of Electrode/Electrolyte Gel/Electrode The element was cut into rectangles of 1 mm×15 mm. Then, as shown in FIG. 1, displacement at a position 10 mm from a short side was measured, when voltage was applied, using a laser displacement meter.
4. Method for Measuring Electric Conductivity of Electrode Electric conductivity of electrode was measured in the following manner. Electrode resistance was measured by bonding gold wires 50 μm in diameter, using a gold paste, to both ends of the electrode, as well as two points set on the surface thereof, flowing a constant electric current with a current generator to both ends of the electrode through the gold wires, and measuring the voltage generated between the two points set on the surface of the electrode. When the thickness of the electrode is d and the width thereof is b, the cross-sectional area S=bd. When the electric current passed through is I, the voltage measured is V, the distance between potential taps is L,
conductance G=I/V [S], and
electric conductivity=GL/S [Scm$^{-1}$].
5. Method for Measuring Young's Modulus The Young's modulus of an electrode film was measured based on the stress-strain characteristic using a tensile tester.
6. Capacitance Measurement The produced electrode film was cut to a 10 mm diameter shape, sandwiched between stainless-steel electrodes, and the measurement was carried out under conditions of ±0.5 V and 0.02 V/s, using the cyclic voltammetry method. The measured value was shown as a capacity value per gram of carbon nanotubes contained in an electrode film (Fg$^{-1}$).
7. Measurement of Thicknesses of Electrode, Gel Electrolyte, and Actuator Element Film The thicknesses of the produced electrode film, gel electrolyte film, and actuator element film formed from the laminate of the electrode film and the gel electrolyte film were measured by means of a micrometer caliper.

Example 1

LS-CNT (5 mg) and EMIBF$_4$ (40 mg) were introduced into a bottle, 1 ml of DMAc as a solvent was added thereto, and the whole material was agitated for 1 hour using a magnetic stirrer. The resulting mixture was solidified to an extent that it did not flow even when the bottle was turned upside-down. It is assumed that the LS-CNT uniformly dispersed in the mixture to form a network and turned the mixture into a gel-like solid. The obtained solid was then irradiated with ultrasonic waves in an ultrasonic cleaner for 30 minutes, and 2 ml of DMAc was added thereto. Thereafter, it was agitated for 2 hours with a stirrer, and a liquid for casting was thereby obtained. A 2.4 ml quantity of the obtained casting liquid was poured into a 25 mm×25 mm cast frame made of PTFE (Teflon: registered trademark) tape. Each casting liquid in each cast frame was dried under reduced pressure at a temperature of 50° C. for 24 hours. Then, the temperature was adjusted to 80° C., and the cast product was dried again under reduced pressure for 24 hours to obtain an electrode film. The properties of the thus-obtained film were measured in accordance with the common experimental procedures explained above, which are summarized in Table 1.

TABLE 1

| Properties of the electrode film obtained in Example 1 | | | |
|---|---|---|---|
| Electric Conductivity | Young's Modulus | Capacitance | Thickness |
| 19.6 Scm$^{-1}$ | 12.5 MPa | 43.7 Fg$^{-1}$ | 79 μm |

Example 2

LS-CNT (5 mg) and EMIBF$_4$ (40 mg) were introduced into a bottle, 1 ml of DMAc as a solvent was added thereto, and the whole material was agitated for 1 hour using a magnetic stirrer. The resulting mixture was solidified to an extent that it did not flow even when the bottle was turned upside-down. It is assumed that the LS-CNT uniformly dispersed in the mixture to form a network and turned the mixture into a gel-like solid. The obtained solid was then irradiated with ultrasonic waves in an ultrasonic cleaner for 1 hour, and 2 ml of DMAc was added thereto. Thereafter, it was agitated for 2 hours with a stirrer, and a liquid for casting was thereby obtained. A 2.4 ml quantity of the obtained casting liquid was poured into a 25 mm×25 mm cast frame made of PTFE (Teflon: registered trademark) tape. Each casting liquid in each cast frame was dried under reduced pressure at a temperature of 50° C. for 24 hours. Then, the temperature was adjusted to 80° C., and the cast product was dried again under reduced pressure for 24 hours to obtain an electrode film. The properties of the thus-obtained film were measured in accordance with the common experimental procedures explained above, which are summarized in Table 2.

TABLE 2

Properties of the electrode film obtained in Example 2

| Electric Conductivity | Young's Modulus | Capacitance | Thickness |
|---|---|---|---|
| 6.7 Scm$^{-1}$ | 12.5 MPa | 23.1 Fg$^{-1}$ | 51 μm |

Comparative Example 1

LS-CNT (5 mg) and EMIBF$_4$ (40 mg) were introduced into a bottle, 1 ml of DMAc as a solvent was added thereto, and the whole material was agitated for 1 hour using a magnetic stirrer. The resulting mixture was solidified to an extent that it did not flow even when the bottle was turned upside-down. It is assumed that the LS-CNT uniformly dispersed in the mixture to form a network and turned the mixture into a gel-like solid. Thereafter, 2 ml of DMAc was further added to the obtained gel-like solid, which was then agitated for 2 hours with a magnetic stirrer, followed by casting and drying out the solvent; however, a film was not produced.

Example 3

Each gel electrolyte layer produced in accordance with the common experimental procedure 3 was sandwiched between the two electrode films produced in Examples 1 and 2, respectively, and was pressed for 1 minute at 70° C. under a pressure of 1.9 N/mm$^2$. Thereby, each electrode/electrolyte/electrode composite (actuator element) was obtained. Table 3 summarizes displacements observed when square wave voltages of ±2.5 V having various frequencies were applied across the electrodes. Even at a frequency of 5 Hz, a displacement of not less than 1 mm was observed. The result shows that the thus-obtained actuator element exhibits high-speed response.

TABLE 3

Displacement response of the element obtained in Example 3

| Voltage frequency (Hz) | 0.01 | 0.1 | 1 | 2 | 5 |
|---|---|---|---|---|---|
| Electrode of Example 1 (mm) | 2.08 | 1.80 | 1.23 | 1.10 | 0.94 |
| Electrode of Example 2 (mm) | 2.62 | 2.03 | 1.84 | 1.64 | 1.50 |

(Thickness of each actuator element:
the element comprising the electrodes of Example 1: 85 μm, and the element comprising the electrodes of Example 2: 66 μm)

Example 4

Figure 5:
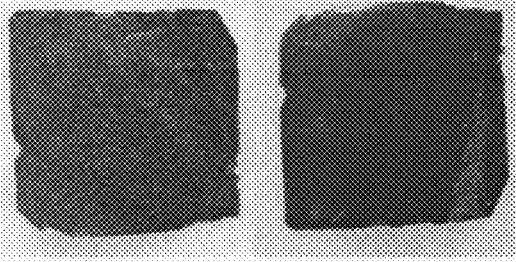
FIG. 5 is photographs of the appearance of an electrode film. The right- and left-side photographs show front and rear side of the film.

A 2 ml quantity of DMAc was first added to each set of components shown in Table 4, and each mixture thereof was agitated for 1 hour using a magnetic stirrer. The resulting mixed products were irradiated with ultrasonic waves in an ultrasonic cleaner for 1 hour.
The resultant mixtures formed gel-like solids, as were seen in Examples 1 and 2. A 4 ml quantity of each DMAc was then added thereto, and agitated for 2 hours to obtain liquids for casting. A 2.4 ml quantity of the obtained casting liquids was cast into 25 mm×25 mm cast frame made of PTFE (Teflon: registered trademark) tape, and each casting liquid in each cast frame was dried under reduced pressure at a temperature of 50° C. for 24 hours. Then, the temperature was adjusted to 80° C., and the resulting cast products were dried again under reduced pressure for 24 hours to obtain electrode films. FIG. 5 is photographs of the appearance (front and rear) of the obtained film S-2. The other casting liquids also produced films similar in uniformity and flexibility to S-2. The properties of the thus-obtained electrode films are summarized in Table 5.

TABLE 4

Components for producing electrode films in Example 4

| Name of Specimen | LS-CNT Weight concentration | LS-CNT | EMIBF$_4$ |
|---|---|---|---|
| S-1 | 11.1 wt % | 10 mg | 80 mg |
| S-2 | 20 wt % | 10 mg | 40 mg |
| S-3 | 50 wt % | 10 mg | 10 mg |

TABLE 5

Properties of the electrode films obtained in Example 4

| Name of Specimen | Electric Conductivity (Scm$^{-1}$) | Young's Modulus (MPa) | Capacitance (Fg$^{-1}$) | Thickness (μm) |
|---|---|---|---|---|
| S-1 | 20.8 | 4.5 | 30.8 | 68.2 |
| S-2 | 25.2 | 11.0 | 31.4 | 31.8 |
| S-3 | 124.3 | 72.4 | 36.2 | 27.5 |

Example 5

In the same manner as in Example 3, composites of the gel electrolyte layer and various kinds of electrode films produced in Example 4 were produced. Then, displacement properties thereof were evaluated by applying voltages having various frequencies and square wave shapes. The results thereof are shown in Tables 6 and 7. When a voltage of ±1.5 V was applied, a large displacement (with a maximum value of 4.52 mm) and a high-speed response (with the highest response frequency being 48 Hz) were observed.

TABLE 6

Displacement response of the actuator element produced using the electrode film obtained in Example 4 upon application of a square wave voltage of ±1.5 V

| | Specimen | | |
|---|---|---|---|
| Frequency | S-1 | S-2 | S-3 |
| 0.01 Hz | 1.55 mm | 4.52 mm | 2.25 mm |
| 0.1 Hz | 1.40 mm | 3.52 mm | 1.64 mm |

(Thickness of actuator element: S-1: 10.3 μm, S-2: 75 μm, S-3: 57 μm)

TABLE 7

Resonance properties of the actuator element produced using the electrode film obtained in Example 4 with a square wave voltage of ±2.5 V applied

|  | S-1 | S-2 | S-3 |
|---|---|---|---|
| Resonance frequency (Hz) | 36 | 30 | 48 |
| Displacement of resonance point (mm) | 2.46 | 1.44 | 1.30 |

Example 6

LS-CNT (15 mg), ethyl methylimidazolium (I) bis(trifluoromethanesulfonyl)imide (EMITFSI) (15 mg), and DMAc (3 ml) were introduced into a bottle provided with a screw. The whole material was then agitated for 2 hours.

The resulting mixture was irradiated with ultrasonic waves in an ultrasonic washing machine for the time shown below in Table 8.

TABLE 8

| Material for producing Electrode film | Time of Ultrasonic Irradiation |
|---|---|
| S-1 h | 1 hour |
| S-10 h | 10 hours |
| S-3 h | 3 hours |
| S-5 h | 5 hours |
| S-7 h | 7 hours |
| S-15 h | 15 hours |

A 6 ml quantity of DMAc was added to each of the resultant mixture, and agitated for 2 hours.

A 2.4 ml quantity of the resulting casting liquid was poured into a 25 mm×25 mm cast frame made of PTFE (Teflon: registered trademark) tape set on a hot plate maintained at a constant temperature of 50° C., and was left to dry for 24 hours.

The cast product was then dried in a vacuum desiccator at 50° C. for 24 hours, and subsequently dried again in the vacuum desiccator at 80° C. for 24 hours.

On completion of the above-mentioned steps, an electrode film (content of LS-CNT: 50 wt %) was obtained. The values of the properties of the six kinds of electrode films above were measured in accordance with the common experimental procedures explained above. The results thereof are summarized in Table 9.

Electrode films having remarkable properties in Young's modulus, electric conductivity and capacitance were successfully obtained.

TABLE 9

| Electrode film | Young's Modulus (MPa) | Electric Conductivity (Scm$^{-1}$) | Capacitance (Fg$^{-1}$) |
|---|---|---|---|
| S-1 h | 177.5 | 168.7 | 44.7 |
| S-3 h | 373.2 | 121.3 | 47.4 |
| S-5 h | 287.3 | 128.6 | 53.6 |
| S-7 h | 86.4 | 160.0 | 89.1 |
| S-10 h | 23.5 | 170.0 | 57.9 |
| S-15 h | 22.6 | 220.0 | 80.2 |

Example 7

The gel electrolyte layer produced in accordance with the common experimental procedure 3 was sandwiched between two electrode films, in which each of the two electrode films was produced under each condition shown in Example 6, and was pressed for 1 minute at 70° C. under a pressure of 1.9 N/mm$^2$. Thereby, each electrode/electrolyte/electrode composite to be used for actuator element was obtained. Tables 10 and 11 show dependences of displacement of actuator element to which square wave voltages having frequencies of 0.1 Hz and 0.01 Hz were applied, respectively.

(Thickness of actuator element:
S1h: 51.5 μm, S3h: 61 μm, S5h: 45 μm, S7h: 46 μm, S10h: 51.5 μm, and S15h: 40.5 μm)

Table 12 shows the responsive property upon the application of a square wave voltage of ±2.5 V having frequencies of 1, 2, 5 and 10 Hz. In particular, the actuator element having S-5h, which was produced with an electrode film prepared by applying ultrasonic waves for 5 hours, shows unexpectedly remarkable properties in both high and low frequencies.

TABLE 10

Displacement of actuator element upon application of the various square wave voltages having frequency of 0.1 Hz

| | Voltage | | |
|---|---|---|---|
| Electrode | ±0.5 V | ±1 V | ±1.5 V |
| S-1 h | 0.40323125 | 0.82314444 | 1.304256 |
| S-3 h |  | 1.12267778 | 2.137244 |
| S-5 h | 0.982975 | 1.9010625 | 3.974844 |
| S-7 h | 0.907808889 | 1.80145556 | 3.115378 |
| S-10 h | 0.8693625 | 1.88766 | 3.559656 |
| S-15 h | 0.931425 | 1.91215556 | 3.301833 |

(Unit of Displacement: mm)

TABLE 11

Displacement of actuator element upon application of the various square wave voltages having frequency of 0.01 Hz

| | Voltage | | |
|---|---|---|---|
| Electrode | ±0.5 V | ±1 V | ±1.5 V |
| S-1 h | 0.59293 | 1.23595 | 2.40615 |
| S-3 h | 0.66925 | 1.4419 | 2.88565 |
| S-5 h | 1.1917 | 2.352 | 5.3318 |
| S-7 h | 1.0739 | 2.1742 | 4.41755 |
| S-10 h | 1.01905 | 2.22955 |  |
| S-15 h | 1.14885 | 2.3801 | 4.56105 |

(Unit of Displacement: mm)

TABLE 12

Displacement of actuator element upon application of the square wave voltage of ±2.5 V at various frequencies

| | Voltage | | | |
|---|---|---|---|---|
| Electrode | 1 Hz | 2 Hz | 5 Hz | 10 Hz |
| S-1 h | 0.09825875 | 0.0544375 | 0.0185 | 0.013191 |
| S-3 h | 0.6393 | 0.40778778 | 0.275217 | 0.233942 |
| S-5 h | 2.917844444 | 2.19247 | 1.6456 | 1.427778 |
| S-7 h | 1.2903 | 0.68735556 | 0.275771 | 0.203772 |
| S-10 h | 0.38029625 | 0.19044333 | 0.07409 | 0.035806 |
| S-15 h | 0.64682625 | 0.30719556 | 0.124736 | 0.052753 |

(Unit of Displacement: mm)

The invention claimed is:

1. An electrically conductive thin film formed from an ionic liquid and carbon nanotubes having an aspect ratio of not less than $10^4$ and being free of polymer.

2. A laminate comprising the electrically conductive thin film layer of claim 1 and an ion conductive layer.

3. An actuator element comprising the laminate of claim 2.

4. An actuator element comprising a laminate including an electrically conductive thin layer and an ion conductive layer, wherein at least two electrically conductive thin film layers having the electrically conductive thin film of claim 1 as the electrode are formed on the surface of the ion conductive layer in such a manner that the two layers are insulated to each other, and the actuator element is deformable by applying potential difference to the electrically conductive thin film layers.

5. An electrically conductive thin film formed from an ionic liquid and carbon nanotubes having a length of not less than 50 μm and being free of polymer.

6. A laminate comprising the electrically conductive thin film layer of claim 5 and an ion conductive layer.

7. An actuator element comprising the laminate of claim 6.

8. An actuator element comprising a laminate including an electrically conductive thin layer and an ion conductive layer, wherein at least two electrically conductive thin film layers having the electrically conductive thin film of claim 5 as the electrode are formed on the surface of the ion conductive layer in such a manner that the two layers are insulated to each other, and the actuator element is deformable by applying potential difference to the electrically conductive thin film layers.

* * * * *